United States Patent

Byun

(10) Patent No.: US 11,144,449 B2
(45) Date of Patent: Oct. 12, 2021

(54) MEMORY SYSTEM AND OPERATION METHOD THEREOF

(71) Applicant: SK hynix Inc., Gyeonggi-do (KR)

(72) Inventor: Eu-Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 101 days.

(21) Appl. No.: 16/566,230

(22) Filed: Sep. 10, 2019

(65) Prior Publication Data

US 2020/0167273 A1 May 28, 2020

(30) Foreign Application Priority Data

Nov. 22, 2018 (KR) .................. 10-2018-0145295

(51) Int. Cl.
*G06F 12/00* (2006.01)
*G06F 12/02* (2006.01)
*G06F 13/16* (2006.01)
*G11C 11/408* (2006.01)
*G11C 11/409* (2006.01)

(52) U.S. Cl.
CPC ...... *G06F 12/0246* (2013.01); *G06F 12/0253* (2013.01); *G06F 13/1673* (2013.01); *G11C 11/409* (2013.01); *G11C 11/4085* (2013.01); *G06F 2212/7201* (2013.01); *G06F 2212/7211* (2013.01)

(58) Field of Classification Search
CPC ............ G06F 12/0246; G06F 12/0253; G06F 13/1673; G06F 2212/7201; G06F 2212/7211; G11C 11/4085; G11C 11/409
See application file for complete search history.

(56) References Cited

U.S. PATENT DOCUMENTS

| | | | |
|---|---|---|---|
| 9,009,565 B1* | 4/2015 | Northcott | G06F 11/108 714/763 |
| 2004/0264254 A1* | 12/2004 | Eggleston | G06F 11/1068 365/185.33 |
| 2009/0237999 A1* | 9/2009 | Li | G11C 11/5628 365/185.12 |
| 2011/0138100 A1* | 6/2011 | Sinclair | G06F 12/0246 711/5 |
| 2014/0258808 A1* | 9/2014 | Akiduki | G06F 11/1068 714/763 |
| 2015/0261797 A1* | 9/2015 | Alcantara | G06F 3/064 707/813 |
| 2016/0202910 A1* | 7/2016 | Ravimohan | G06F 12/0607 711/103 |
| 2017/0010815 A1 | 1/2017 | Sprouse et al. | |
| 2017/0199703 A1* | 7/2017 | Ravimohan | G06F 3/0659 |
| 2018/0121128 A1* | 5/2018 | Doyle | G06F 3/064 |
| 2021/0011842 A1* | 1/2021 | Lee | G06F 9/5016 |
| 2021/0026557 A1* | 1/2021 | Cariello | G06F 3/0673 |
| 2021/0034301 A1* | 2/2021 | Zhou | G06F 12/0246 |
| 2021/0042225 A1* | 2/2021 | Lee | G06F 12/0804 |

FOREIGN PATENT DOCUMENTS

KR  10-2016-0114051  10/2016

* cited by examiner

*Primary Examiner* — Prasith Thammavong
(74) *Attorney, Agent, or Firm* — IP & T Group LLP

(57) ABSTRACT

An operation method of a memory system includes a memory device including plural level memory cells. The operation method includes allocating a physical address according to a physical address allocation scheme which is determined based on an attribute of a write command; and performing a write operation on the allocated physical address.

15 Claims, 15 Drawing Sheets

MEMORY SYSTEM AND OPERATION METHOD THEREOF

CROSS-REFERENCE TO RELATED APPLICATION

This application claims priority under 35 U.S.C. § 119 to Korean Patent Application No. 10-2018-0145295 filed on Nov. 22, 2018, which is incorporated herein by reference in its entirety.

BACKGROUND

1. Field

Exemplary embodiments relate to a memory system, and more particularly, to a memory system including a memory device, and an operation method thereof.

2. Discussion of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since memory systems have no moving parts, memory systems provide advantages such as excellent stability and durability, high information access speed, and low power consumption. Examples of memory systems having such advantages include universal serial bus (USB) memory devices, memory cards having various interfaces, and solid state drives (SSDs).

SUMMARY

Various embodiments are directed to a memory system capable of improving access performance of a superblock, and an operation method thereof.

In an embodiment, there is provided an operation method of a memory system which includes a memory device including plural level memory cells. The operation method may include: allocating a physical address according to a physical address allocation scheme which is determined based on an attribute of a write command; and performing a write operation on the allocated physical address.

In an embodiment, a memory system may include: a memory device including plural level memory cells; and a controller suitable for controlling the memory device. The controller may include a processor suitable for allocating a physical address according to a physical address allocation scheme which is determined based on an attribute of a write command, and wherein the memory device may perform a write operation on the allocated physical address.

In an embodiment, a system may include: a memory device including a plurality of memory dies, each die including a plurality of memory blocks, each block including memory cells coupled to a super wordline, each cell including multiple logical pages; and a controller suitable for: receiving a write command; determining one of a first allocation scheme and a second allocation scheme based on an attribute of the write command; and performing a write operation for data corresponding to the write command, on memory blocks among the plurality of memory blocks, which are selected based on the determined allocation scheme, wherein the first allocation scheme sequentially selects memory blocks in ascending order of a die, and wherein the second allocation scheme sequentially selects memory blocks in ascending order of a die and a logical page.

DETAILED DESCRIPTION

Hereafter, exemplary embodiments of the present invention will be described with reference to the accompanying drawings. It should be understood that the following descriptions will be focused on portions required for understanding an operation in accordance with an embodiment, and descriptions of the other portions will be left out in order not to unnecessarily obscure subject matters of the present disclosure.

Hereafter, exemplary embodiments will be described in detail with reference to the accompanying drawings.

Figure 1:
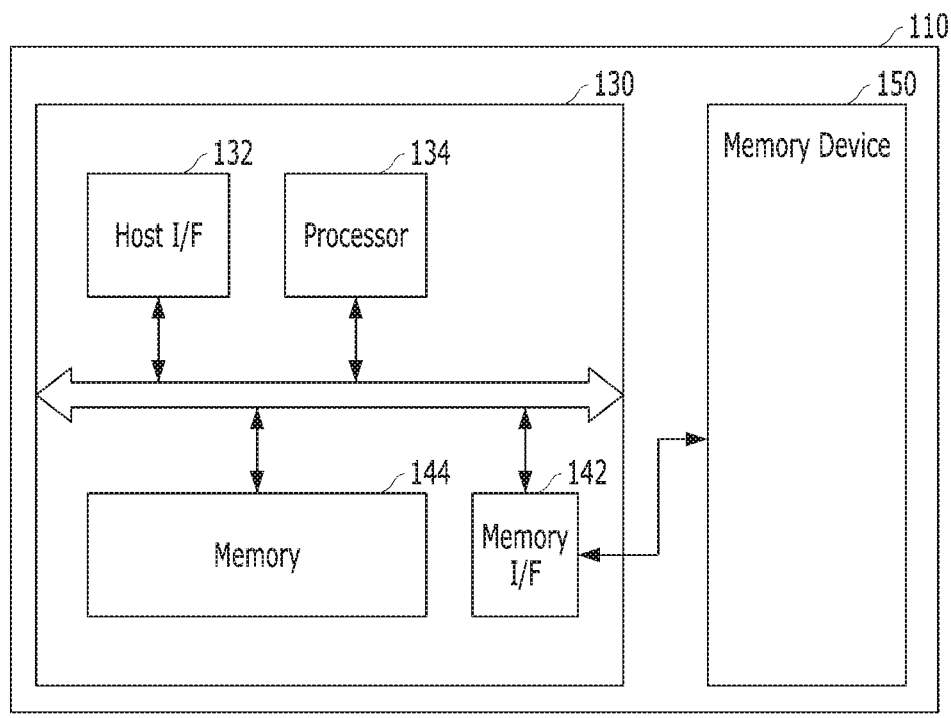
FIG. 1 is a diagram schematically illustrating a memory system in accordance with an embodiment.

FIG. 1 schematically illustrates a memory system 110 in accordance with an embodiment.

Referring to FIG. 1, the memory system 110 may operate in response to a request of a host (not shown). In particular, the memory system 110 may store data accessed by the host. That is, the memory system 110 may be used as a main memory device or an auxiliary memory device of the host.

The memory system 110 may operate to store data for the host in response to a request of the host. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and a memory stick. The MMC may include an embedded MMC (eMMC), a reduced size MMC (RS-MMC) and a micro-MMC. The SD card may include a mini-SD card and a micro-SD card.

The memory system 110 may be embodied by various types of storage devices. Examples of such storage devices may include, but are not limited to, volatile memory devices such as a dynamic random access memory (DRAM) and a static RAM (SRAM), and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory. The flash memory may have a 3-dimensional (3D) stack structure.

The memory system 110 may include a controller 130 and a memory device 150.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 will be described in detail with reference to FIGS. 2 and 3.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, program, and erase operations of the memory device 150.

The controller 130 may include a host interface (I/F) 132, a processor 134, a memory I/F 142, and a memory 144.

The host I/F 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (DATA), enhanced small disk interface (ESDI) and integrated drive electronics (IDE). The host I/F 132 may be driven through firmware referred to as a host interface layer (HIL) in order to exchange data with the host.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory i/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150. The memory I/F 142 may be driven through firmware referred to as a flash interface layer (FIL) in order to exchange data with the memory device 150.

The memory 144 may serve as a working memory of the memory system 110 and the controller 130, and store data for driving the memory system 110 and the controller 130. The controller 130 may control the memory device 150 to perform read, program, and erase operations in response to a request from the host. The controller 130 may provide data read from the memory device 150 to the host, may store data provided from the host into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. By way of example, FIG. 1 illustrates the memory 144 disposed within the controller 130. In an embodiment, the memory 144 may be embodied by an external volatile memory having a memory interface which transfers data between the memory 144 and the controller 130.

As described above, the memory 144 may store data required for performing a data write/read operation between the host and the memory device 150. In order to store such data, the memory 144 may include a program memory, data memory, write buffer/cache, read buffer/cache, data buffer/cache, map buffer/cache or the like.

The processor 134 may control the overall operations of the memory system 110. The processor 134 may drive firmware to control the overall operations of the memory system 110. The firmware may be referred to as flash translation layer (FTL). The processor 134 may be realized as a microprocessor or a central processing unit (CPU).

For example, the controller 130 may perform an operation requested by the host through the processor 134. In other words, the controller 130 may perform a command operation corresponding to a command received from the host. The controller 130 may perform a foreground operation as the command operation corresponding to the command received from the host. For example, the controller 130 may perform a program operation corresponding to a write command, a read operation corresponding to a read command, an erase operation corresponding to an erase command, and a parameter set operation corresponding to a set parameter command or a set feature command.

The controller 130 may perform a background operation onto the memory device 150 through the processor 134. The background operation performed onto the memory device 150 may include an operation of copying and processing data stored in some memory blocks among the memory blocks of the memory device 150 into other memory blocks, e.g., a garbage collection (GC) operation, an operation of swapping between the memory blocks or between the data of the memory blocks, e.g., a wear-leveling (WL) operation, an operation of storing the map data stored in the controller 130 in the memory blocks, e.g, a map flush operation, or an operation of managing bad blocks of the memory device 150, e.g., a bad block management operation of detecting and processing bad blocks among the memory blocks.

Figure 2:
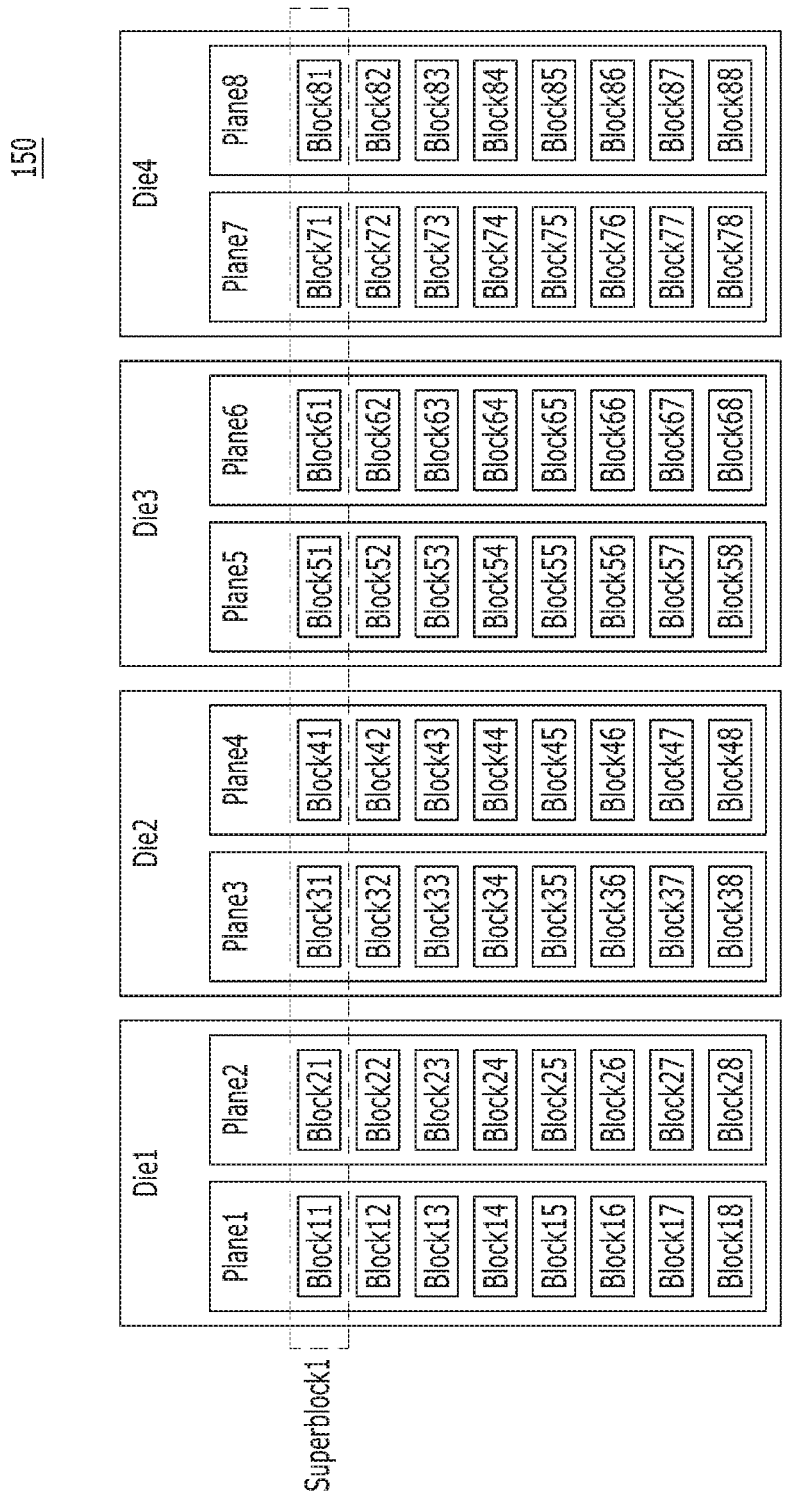
FIG. 2 is a diagram illustrating a plurality of dies included in a memory device.

FIG. 2 illustrates a plurality of dies Die1 to Die4 in the memory device 150.

Referring to FIG. 2, the memory device 150 may include one or more memory dies. Each of the dies may include one or more planes. By way of example, FIG. 2 illustrates four dies Die1 to Die4 each including two planes. That is, the memory device 150 may include eight planes Plane1 to Plane8.

Each of the planes Plane1 to Plane8 may include a plurality of memory blocks.

The memory device 150 may be a nonvolatile memory device, for example, a flash memory. Additionally, the flash memory may have a three-dimensional stack structure.

Hereafter, the configuration in which the memory device 150 is implemented with a nonvolatile memory such as a NAND flash memory will be exemplified. However, the present embodiment is not limited to such a configuration, but the memory device 150 may be implemented with a NOR-type flash memory, a hybrid flash memory in which at least two or more types of memory cells are mixed, or a one-NAND flash memory having a controller embedded in a memory chip. Furthermore, the memory device 150 may be implemented as a flash memory device having a charge storage layer formed of a conductive floating gate or a charge trap flash (CTF) memory device having a charge storage layer formed of a dielectric layer. In addition, the memory device 150 may be implemented as any one of memories such as a phase change random access memory (PCRAM), a resistive random access memory (RRAM or ReRAM), a ferroelectric random access memory (FRAM) and a spin transfer torque magnetic random access memory (STT-RAM or STT-MRAM).

The plurality of planes Plane1 to Plane8 may operate in parallel to one another. In order to improve the parallel processing performance of the memory system 110, the controller 130 may configure one superblock by logically coupling memory blocks included in the respective planes Plane1 to Plane8. By way of example, FIG. 2 illustrates a first superblock Superblock1 composed of 11th, 21st, 31st, 41st, 51st, 61st, 71st and 81st blocks Block11, Block21, Block31, Block41, Block51, Block61, Block71 and Block81 (hereafter, abbreviated to Block11 to Block81), among the memory blocks included in the respective planes Plane1 to Plane8.

In order to perform write operations on a superblock in parallel, the processor 134 may pair write commands and provide the paired write commands to the respective dies Die1 to Die4 such that write data are interleaved. When the dies Die1 to Die4 divide the paired write commands and provide the divided write commands to the internal planes, the plurality of planes Plane1 to Plane8 may perform the write operations in parallel.

Figure 3:
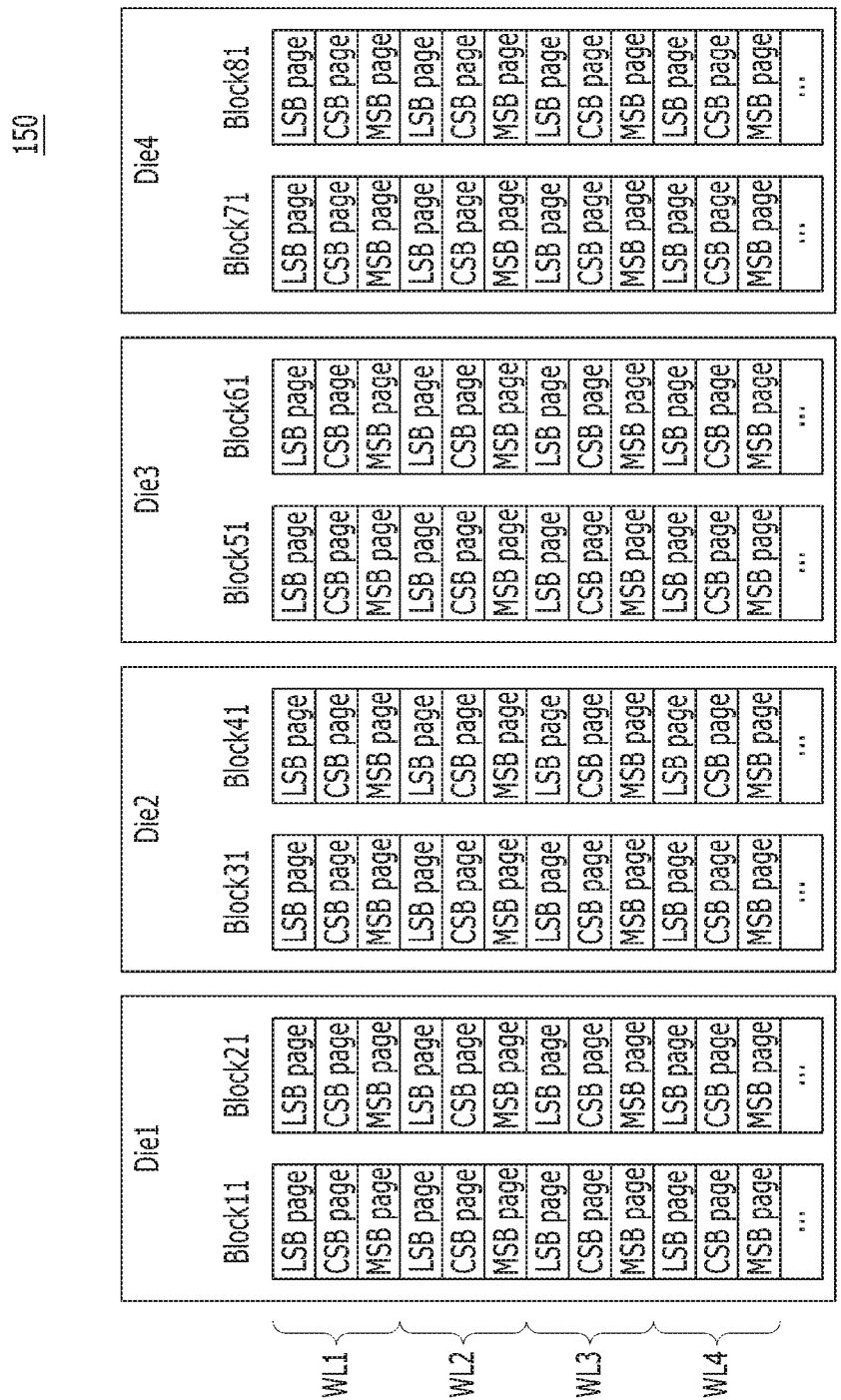
FIG. 3 is a diagram illustrating memory blocks included in each of the dies of the memory device.

FIG. 3 illustrates memory blocks Block11 to Block81 included in the respective dies Die1 to Die4 of the memory device.

Referring to FIG. 3, each of the memory blocks Block11 to Block81 may include memory cells (not illustrated) coupled to one or more word lines including the four word lines WL1 to WL4. In an implementation of the memory device 150, one memory cell may store a plurality of bit values. A plural level cell memory block may include plural level memory cells each capable of storing a plurality of bit values.

Hereafter, the case in which the memory blocks in each of the dies Die1 to Die4 are triple level cell (TLC) memory blocks will be exemplified in order to describe the present embodiments.

A TLC may store a total of three bits, i.e. the most significant bit (MSB), the central significant bit (CSB), and the least significant bit (LSB). The respective LSBs of TLCs coupled to one word line may constitute an LSB page. The CSBs of the TLCs coupled to one word line may constitute a CSB page, and the MSBs of the TLCs coupled to one word line may constitute an MSB page. In this specification, each of the LSB page, the CSB page and the MSB page may be defined as one logical page.

Each of the planes may perform a one-shot program operation. Specifically, the plane may buffer data acquired from the controller 130 in an internal page buffer (not illustrated), the data having a size of three logical pages. The plane may drive a word line and bit line (not illustrated) to control memory cells coupled to one word line, such that the memory cells have a target state of eight threshold voltage states. Thus, the plane may write three logical pages corresponding to one word line at once.

When each of the planes performs a one-shot program operation, the minimum unit of a write operation of the memory device 150 may be set to three logical pages corresponding to one word line. The minimum unit of an erase operation of the memory device 150 may be set to one memory block. That is, the unit of the erase operation and the unit of the write operation in the memory device 150 may be different from each other. Thus, the memory system 110 may write data to be updated to a page in an erase state, and invalidate the data before update, in order to update the data stored therein.

Therefore, a logical address of the host may not coincide with a physical address of the memory device 150. The processor 134 may allocate a physical address corresponding to the logical address of write data, whenever performing a write operation. Then, the processor 134 may store map data inside or outside the memory system 110, the map data indicating the corresponding relationship between the logical address and the physical address.

Figure 4:
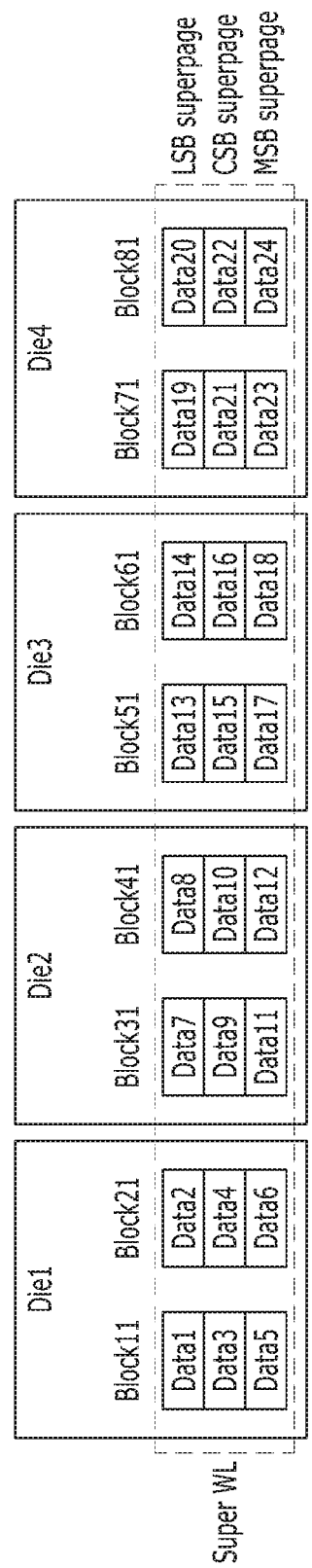
FIGS. 4 to 5B are diagrams illustrating physical address allocation schemes for performing a write operation.
Figure 5A:
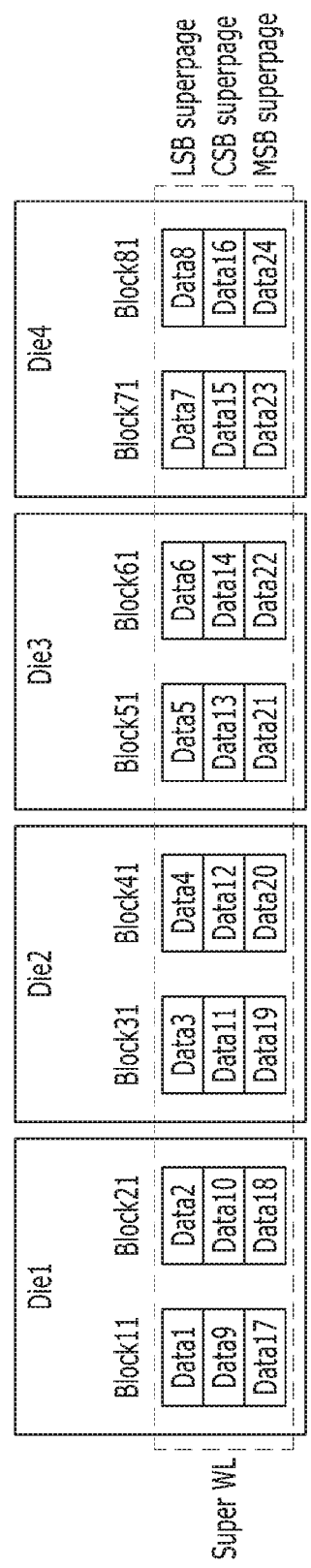
Figure 5B:
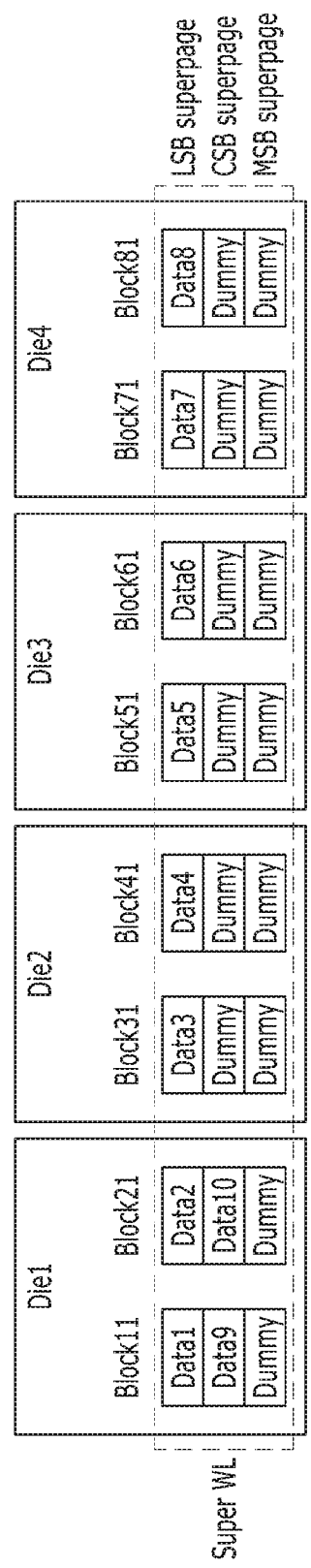

FIGS. 4 to 5B are diagrams illustrating physical address allocation schemes for performing a write operation.

The processor 134 may configure a super word line by logically coupling word lines included in the respective memory blocks Block11 to Block81 constituting the first superblock Superblock1. Memory cells coupled to the super word line may constitute a plurality of logical pages. Among the plurality of logical pages, the LSB pages may constitute an LSB superpage, the CSB pages may constitute a CSB superpage, and the MSB pages may constitute an MSB superpage. FIGS. 4 to 5B illustrate a plurality of logical pages corresponding to one super word line. The plurality of dies Die1 to Die4 may perform write operations on the plurality of logical pages in parallel in response to control of the processor 134.

The scheme in which the processor 134 allocates physical addresses to interleave data to be written to the plurality of logical pages may be roughly divided into two types of schemes.

FIG. 4 is a diagram illustrating a first scheme.

The processor 134 may allocate physical addresses according to the first scheme that interleaves data to the plurality of logical pages in order of die, and control parallel write operations of the memory device 150.

Referring to FIG. 4, the processor 134 may allocate physical addresses to write first to 24th data Data10 to Data24 which are consecutive to one another. Specifically, the processor 134 may allocate the physical addresses to interleave write data, such that the first to sixth data Data1 to Data6 are written to the logical pages in the first die, among the plurality of logical pages, and the seventh to 12th data Data7 to Data12 are written to the logical pages in the second die.

When the physical addresses are allocated according to the first scheme, the performance of the sequential read operation of the memory system 110 may be reduced. For example, when the first to sixth data Data1 to Data6 are read, the first die Die1 may be intensively accessed, and the other dies may not be accessed at all. Therefore, the parallel processing performance of the memory device 150 may be reduced.

FIGS. 5A and 5B are diagrams illustrating a second scheme.

In order to maximize the parallel processing performance of the memory system 110, the processor 134 may allocate physical addresses according to the second scheme that interleaves data across the plurality of dies in order of superpage.

Referring to FIG. 5A, the processor 134 may allocate physical addresses to write first to 24th data Data1 to Data24 which are consecutive to one another. Specifically, the processor 134 may allocate the physical addresses to interleave write data, such that, for example, the first to eighth data Data1 to Data8 are written to the logical pages included in the LSB superpage of the plurality of logical pages, and the ninth to 16th data Data9 to Data16 are written to the logical pages included in the CSB superpage.

When the physical addresses are allocated according to the second scheme, the sequential read performance of the memory system 110 may be improved. However, when the physical addresses are allocated according to the second scheme in order to frequently write a small size of data, the memory space efficiency of the memory device 150 may be reduced.

Referring to FIG. 5B, when first to tenth data Data1 to Data10 are written, the processor 134 may allocate the entire physical addresses of the LSB superpage and some physical addresses of the CSB superpage according to the second scheme. When the processor 134 provides a write command to the first to fourth dies Die1 to Die4, the first to eighth planes Plane1 to Plane8 may perform a one-shot program operation in response to the write command. When the first to eighth planes Plane1 to Plane8 perform a one-shot program operation, dummy data needs to be written to logical pages in which no data are to be stored. FIG. 5B illustrates that dummy data are written to 14 logical pages.

Referring back to FIG. 4, when the processor 134 allocates physical addresses according to the first scheme to write the first to tenth data Data1 to Data10, only the first and second dies Die1 to Diet may perform a one-shot program operation, and the processor 134 may write dummy data to only two logical pages.

In short, when each of the planes in the memory device 150 includes the plurality of memory blocks and writes data to the plurality of memory blocks through a one-shot program operation, the physical address allocation scheme of the memory device 150 may include the first and second schemes, and the first and second schemes may have a trade-off relationship.

In accordance with the present embodiment, the controller 130 may determine the physical address allocation scheme as one of the first and second schemes based on a property of a write command, and control the memory device 150 to perform a write operation on a logical page corresponding to an allocated physical address according to the determined scheme. Therefore, the access performance of the memory system 110 may be optimized based on an attribute of the write command.

Figure 6:
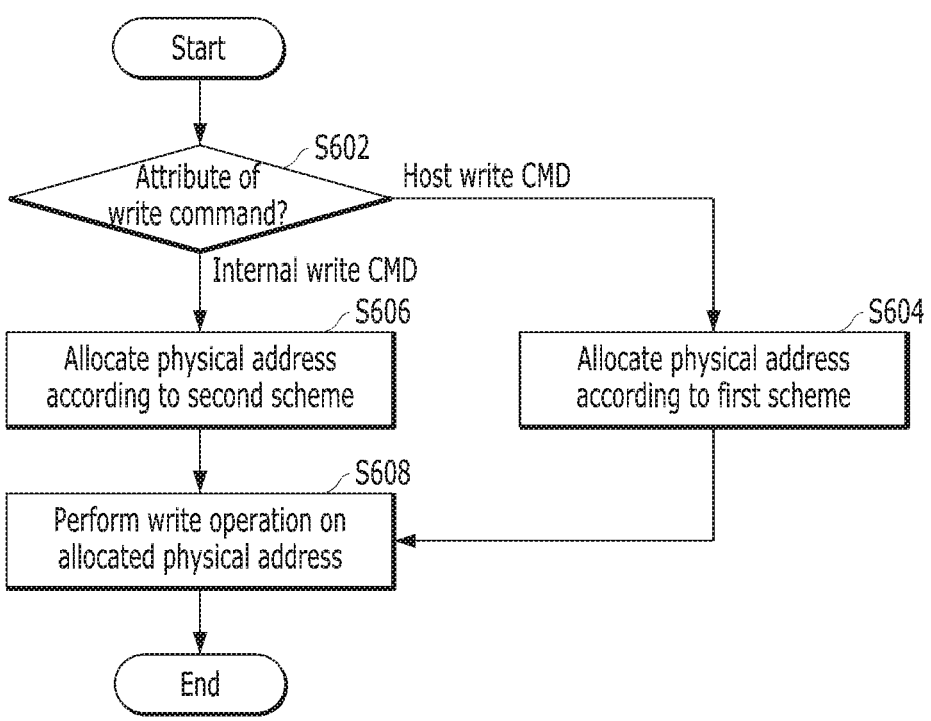
FIGS. 6 and 7 are flowcharts illustrating a write operation of a memory system in accordance with an embodiment.

FIG. 6 is a flowchart illustrating a write operation of the memory system 110 in accordance with an embodiment.

Referring to FIG. 6, in step S602, the processor 134 may determine the attribute of a write command in response to the write command.

The attribute of the write command may indicate any one of a host write command and an internal write command depending on a request of the host.

The processor 134 may receive a flush request from the host while providing the host write command to the memory device 150 in response to the request of the host. The processor 134 may stop the operation of providing the host write command in response to the flush request, and provide the other part of the host write command to the memory device 150 after providing a flush command to the memory device 150. That is, although the host provides a write command for sequential data, the sequential data may be divided into data chunks, each small size, and then written to the memory device 150. Thus, when the processor 134 allocates physical addresses according to the second scheme in order to perform a host write operation, the memory space efficiency of the memory device 150 may be reduced.

When the write command is a write command from the host ("Host write CMD" in step S602), the processor 134 may allocate a physical address according to the first scheme in step S604.

While an internal write operation is performed, the controller 130 may receive no flush command from the host. Thus, the processor 134 does not stop the operation of providing the internal write command to the memory device 150. Therefore, although the processor 134 allocates a physical address according to the second scheme in order to perform the internal write operation, the memory space efficiency of the memory device 150 is less likely to be reduced.

When the write command is an internal write command ("Internal write CMD" in step S602), the processor 134 may allocate a physical address according to the second scheme in step S606, thereby improving the parallel processing performance.

In an embodiment, the internal write command may be a background operation command such as a garbage collection command, a wear-leveling command or a read reclaim command.

In step S608, the processor 134 may provide a write command to the memory device 150 to perform a write operation on the allocated physical address. The memory device 150 may perform the write operation in response to the write command. The processor 134 may update map data between a logical address and a physical address.

Figure 7:
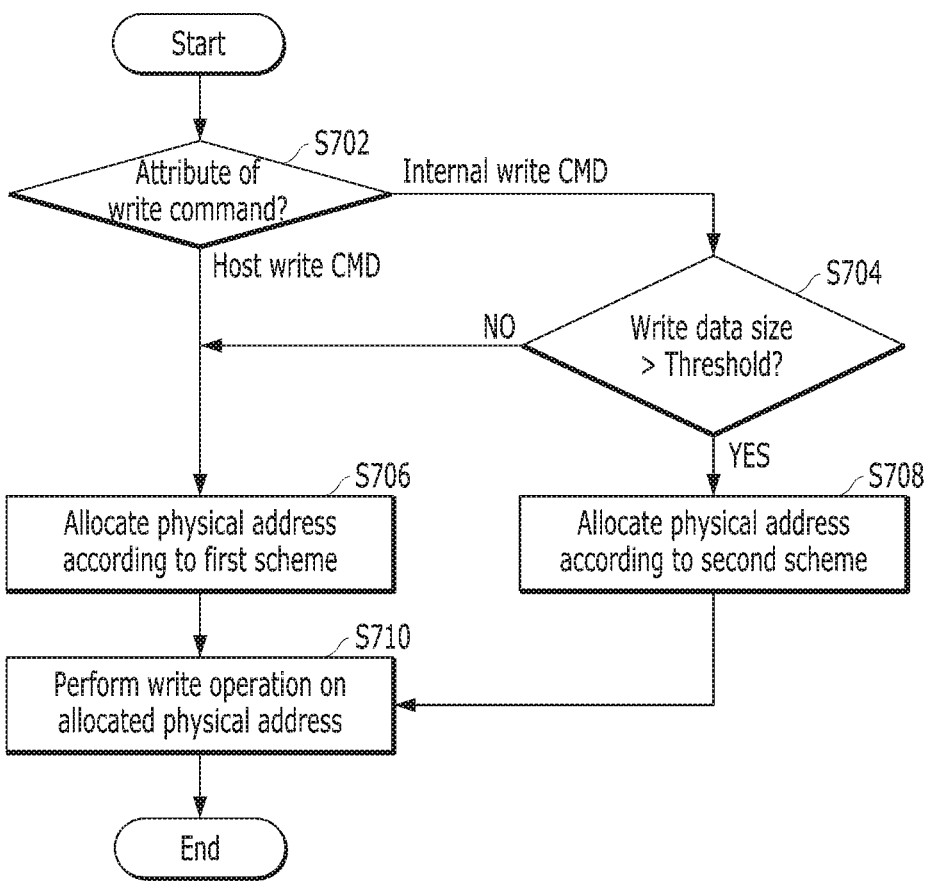

FIG. 7 is a flowchart illustrating a write operation of the memory system 110 in accordance with an embodiment.

Referring to FIG. 7, in response to a write command, the processor 134 may determine the attribute of the write command in step S702.

When the write command is a write command from the host ("Host write CMD" in step S702), the processor 134 may allocate a physical address according to the first scheme in response to the write command, in step S704.

When the write command is an internal write command ("Internal write CMD" in step S702), the processor 134 may determine whether the size of write data corresponding to the write command exceeds a predetermined threshold value, in step S706.

When the size of the write data exceeds the predetermined threshold value ("YES" in step S706), the processor 134 may allocate a physical address according to the second scheme in response to the write command, in step S708.

When the size of the write data does not exceed the predetermined threshold value ("NO" in step S706), the processor 134 may allocate a physical address according to the first scheme in response to the write command in step S704, thereby increasing the memory space efficiency.

In an embodiment, the internal write command may be a background operation command such as a garbage collection command, a wear-leveling command or a read reclaim command.

In step S710, the processor 134 may provide a write command to the memory device 150 to perform a write operation on the allocated physical address. The memory device 150 may perform the write operation in response to the write command. The processor 134 may update map data between a logical address and a physical address.

In an embodiment, the physical address allocation scheme may be changed while one superblock is written.

Figure 8:
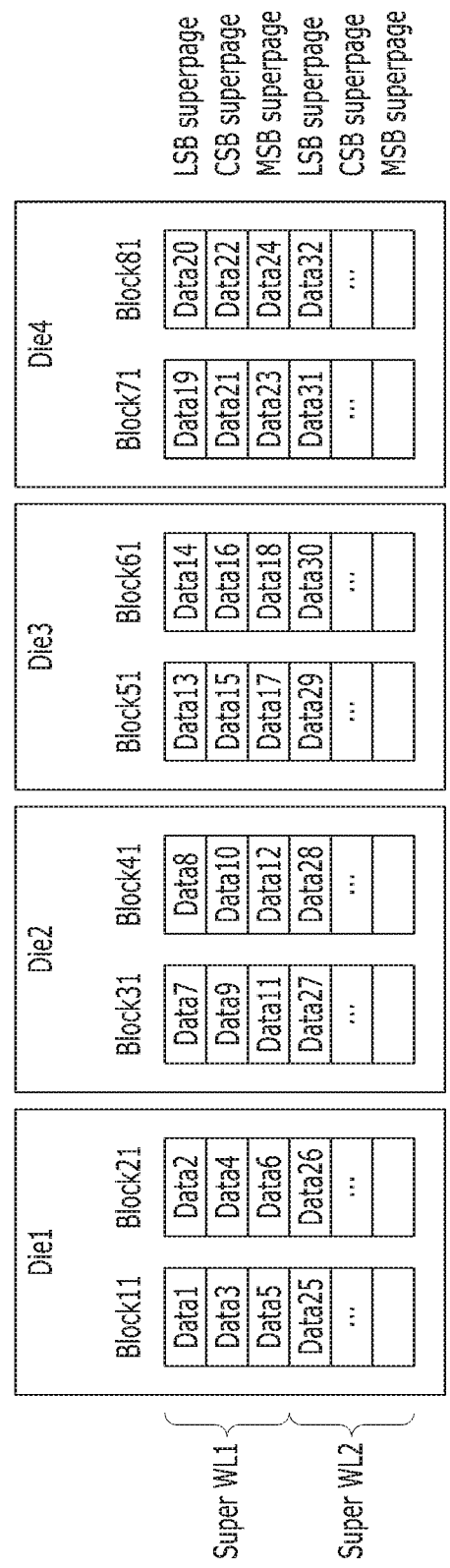
FIG. 8 is a diagram illustrating a physical address allocation scheme being changed while one superblock is written.

FIG. 8 is a diagram illustrating a physical address allocation scheme being changed while one superblock is written.

Referring to FIG. 8, first to 12th data Data1 to Data12 which are sequential data may be written in a memory space corresponding to a physical address allocated by the first scheme. Specifically, the first to 12th data Data1 to Data12 may be written in logical pages included in first and second dies Die1 to Diet among a plurality of logical pages corresponding to a first super word line.

When the physical address allocation scheme is changed to the second scheme, the processor 134 may allocate physical addresses of logical pages having no data written therein, among the plurality of logical pages corresponding to the first super word line, according to the second scheme, and allocate physical addresses of a plurality of logical pages corresponding to a second super word line according to the second scheme, in order to perform a write operation. Referring to FIG. 8, 13th to 32nd data Data13 to Data32 which are sequential data may be written in a memory space corresponding to the physical address allocated by the second scheme.

Figure 9:
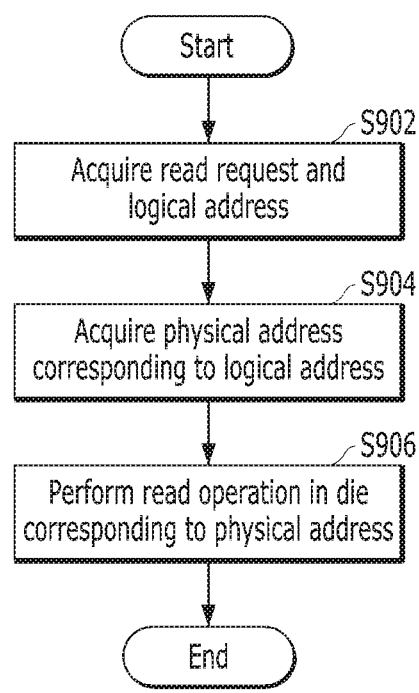
FIG. 9 is a flowchart illustrating a read operation of a memory system in accordance with the present embodiment.

FIG. 9 is a flowchart illustrating a read operation of the memory system 110 in accordance with an embodiment.

Referring to FIG. 9, in step S902, the processor 134 may acquire a read command and a read logical address from the host, the read logical address indicating an address where a read command is to be performed.

In step S904, the processor 134 may acquire a physical address corresponding to the read logical address by referring to map data.

In an embodiment, the map data may include mapping information between logical addresses and physical addresses for all of the logical addresses. The map data may include data as the physical address, the data indicating a die, plane, memory block and page in which write data are stored, for example.

In step S906, the processor 134 may provide a read command to a die corresponding to the acquired physical address, such that the die performs a read operation.

The read operation may be irrelevant to the physical address allocation scheme. For example, first data may be stored in the first logical page of the 11th block in the first plane of the first die. Regardless of whether the first data is stored in the corresponding physical position by the first scheme or the second scheme, the processor 134 may provide a read command to read the data stored in the first logical page of the 11th block in the first plane of the first die.

In accordance with the present embodiment, the memory efficiency and the access performance of the memory system 110 may be optimized based on the attribute of the write command.

FIGS. 10 to 18 are diagrams schematically illustrating application examples of the data processing system of FIGS. 1 to 9 according to various embodiments.

Figure 10:
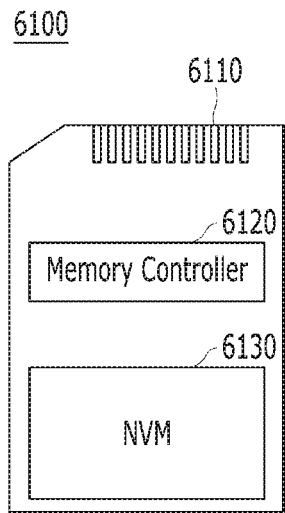
FIGS. 10 to 18 are diagrams schematically illustrating examples of a data processing system including a memory system in accordance with an embodiment.

FIG. 10 is a diagram schematically illustrating the data processing system including the memory system in accordance with an embodiment. By way of example, FIG. 10 schematically illustrates a memory card system 6100 to which the memory system in accordance with an embodiment is applied.

Referring to FIG. 10, the memory card system 6100 may include a memory controller 6120, a memory device 6130 and a connector 6110.

The memory controller 6120 may be connected to the memory device 6130 embodied by a nonvolatile memory (NVM), and configured to access the memory device 6130. For example, the memory controller 6120 may be configured to control read, write, erase and background operations of the memory device 6130. The memory controller 6120 may be configured to provide an interface between the memory device 6130 and a host (not shown), and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

As shown in FIG. 1, the memory controller 6120 may include a random access memory (RAM), a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with an embodiment may be applied to wired and/or wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state drive (SSD). For another example, the memory controller 6120 and the memory device 6130 may form a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), an secured digital (SD) card (e.g., miniSD card, microSD card and SDHC card) and a universal flash storage (UFS).

Figure 11:
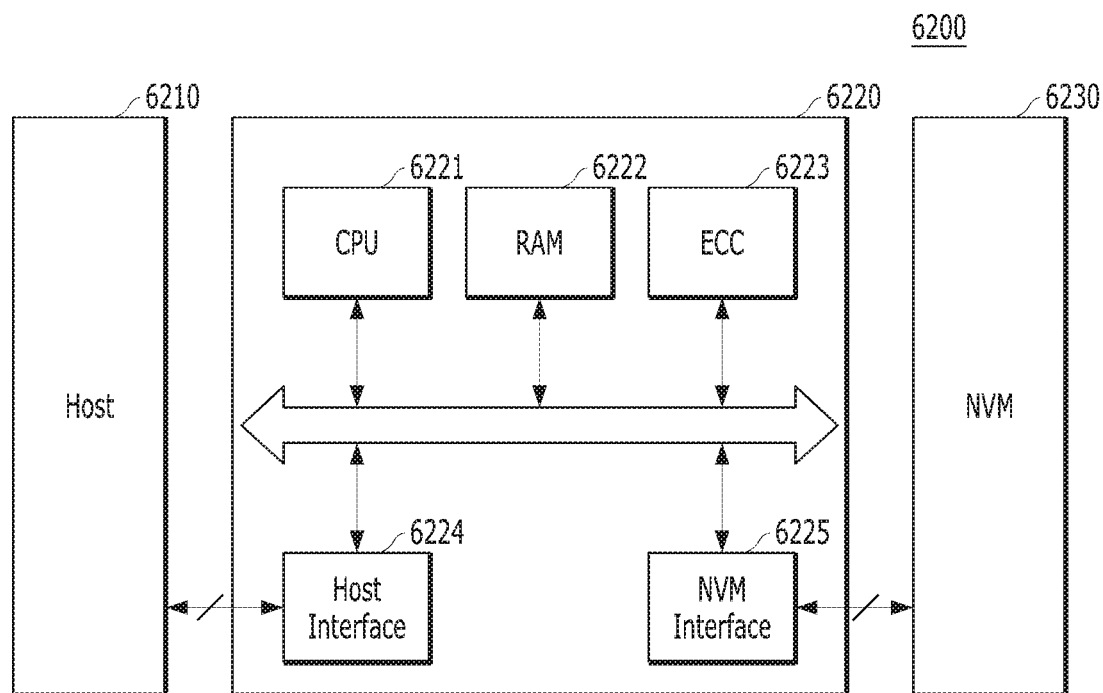

FIG. 11 is a diagram schematically illustrating another example of a data processing system 6200 including the memory system in accordance with an embodiment.

Referring to FIG. 11, the data processing system 6200 may include a memory device 6230 having one or more nonvolatile memories (NVMs) and a memory controller 6220 for controlling the memory device 6230. The data processing system 6200 may serve as a storage medium such as a memory card (CF card, SD card or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit and/or receive data to and/or from the host 6210 through the host interface 6224, and transmit/receive data to/from the memory device 6230 through the NVM interface 6225. The host interface 6224 may be connected to the host 6210 through a parallel advanced technology attachment (PATA) bus, serial advanced technology attachment (BATA) bus, small computer system interface (SCSI), universal serial bus (USB), peripheral component interconnect-express (PCIe) or NAND interface. The memory controller 6220 may have a wireless communication function with a mobile communication protocol such as wireless fidelity (WiFi) or Long Term Evolution (LTE). The memory controller 6220 may be connected to an external device, for example, the host 6210 or another external device, and then transmit and/or receive data to and/or from the external device. In particular, as the memory controller 6220 is configured to communicate with the external device through one or more of various communication protocols, the memory system and the data processing system in accordance with an embodiment may be applied to wired and/or wireless electronic devices or particularly a mobile electronic device.

Figure 12:
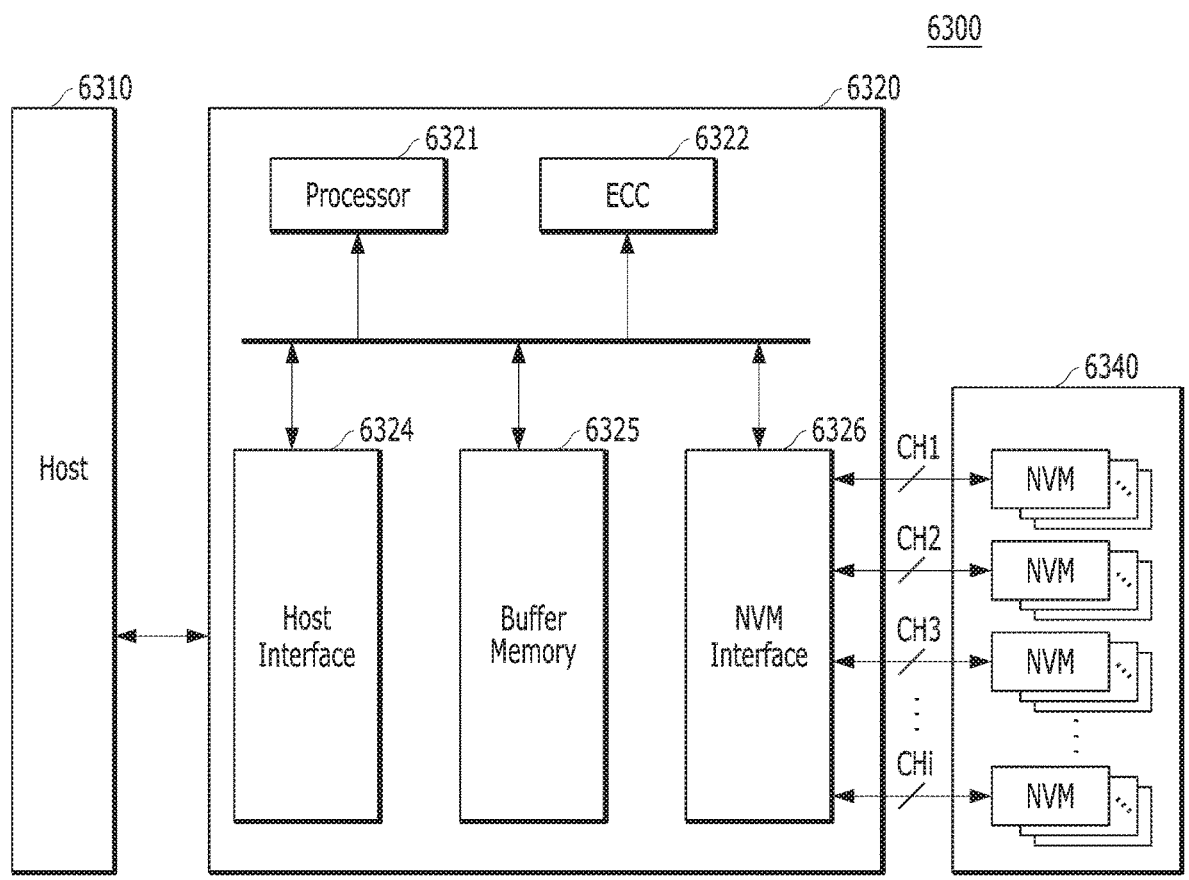

FIG. 12 is a diagram schematically illustrating another example of the data processing system including the memory system in accordance with an embodiment. By way of example, FIG. 12 illustrates a solid state drive (SSD) 6300 to which the memory system may be applied.

Referring to FIG. 12, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as dynamic random access memory (DRAM), synchronous DRAM (SDRAM), double data rate (DDR) SDRAM, low power DDR (LPDDR) SDRAM and graphics RAM (GRAM) or nonvolatile memories such as ferroelectric RAM (FRAM), resistive RAM (RRAM or ReRAM), spin-transfer torque magnetic RAM (STT-MRAM) and phase-change RAM (PRAM). For convenience, FIG. 12 illustrates that the buffer memory 6325 exists in the controller 6320. However, the buffer memory 6325 may exist outside the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310. The nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
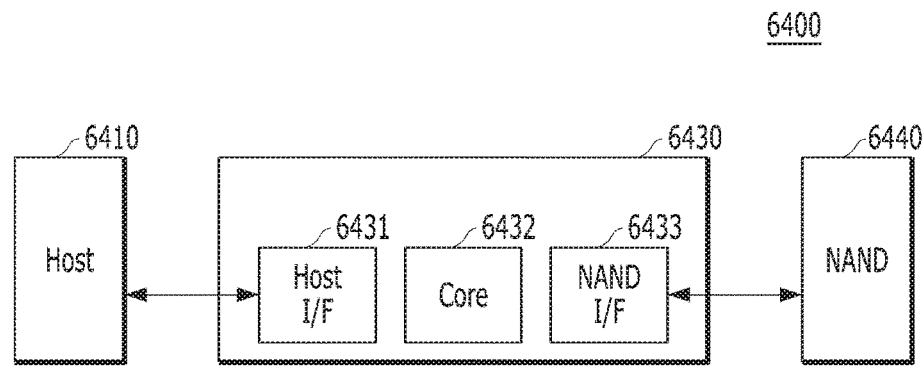

FIG. 13 is a diagram schematically illustrating another example of the data processing system including the memory system in accordance with an embodiment. By way of example, FIG. 13 illustrates an embedded Multi-Media Card (eMMC) 6400 to which the memory system may be applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

The controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

The memory controller 6120, the memory controller 6220, the controller 6320 and the controller 6430 may determine the physical address allocation scheme as any one of the first and second schemes based on the property of a write command, and control the memory device to perform a write operation on a logical page corresponding to the allocated physical address according to the determined scheme, in order to optimize the access performance.

FIGS. 14 to 17 are diagrams schematically illustrating other examples of the data processing system including the memory system in accordance with one or more embodiments. By way of example, FIGS. 14 to 17 illustrate universal flash storage (UFS) systems to which the memory system may be applied. The controllers in accordance with the various embodiments described with reference to FIGS. 1 to 13 may be applied to the UFS which is described with reference to FIGS. 14 to 17.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices, particularly mobile electronic devices, the UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices, particularly mobile electronic devices, through UFS protocols. The UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, universal storage bus (USB) Flash Drives (UFDs), multi-media card (MMC), secure digital (SD), mini-SD, and micro-SD.

Figure 14:
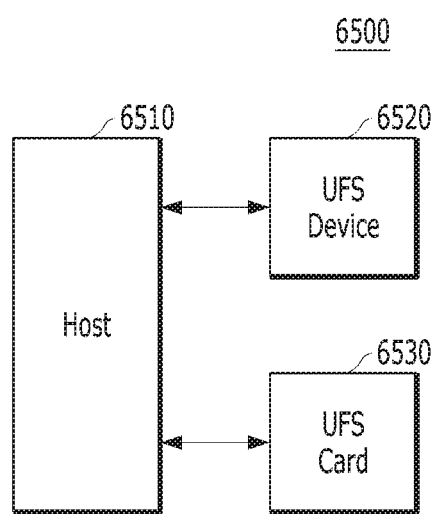

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520, or connected in series or in the form of a chain to the UFS device 6520.

Figure 15:
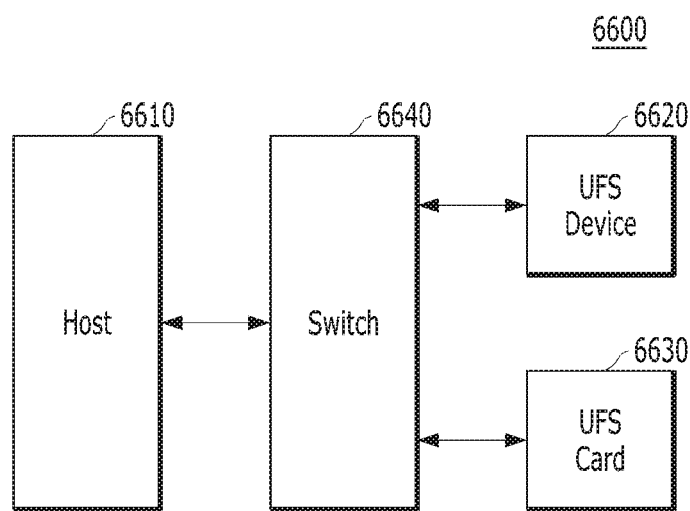

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 16:
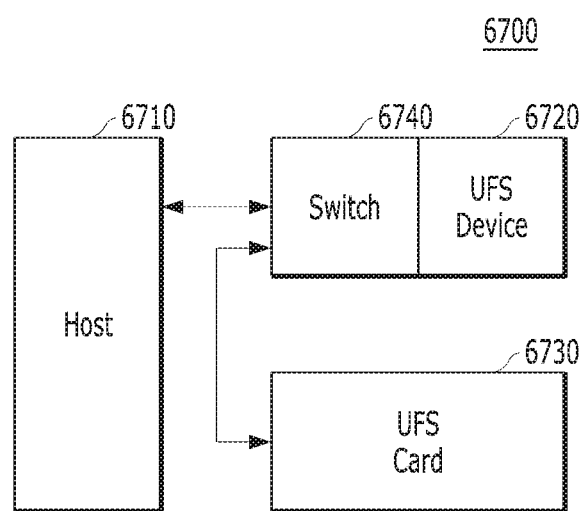

In the UFS system 6700 illustrated in FIG. 16, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710, or connected in series or in the form of a chain to each other. Furthermore, a plurality of UFS cards may be connected in parallel or in the form of a star to the UFS device 6720.

Figure 17:
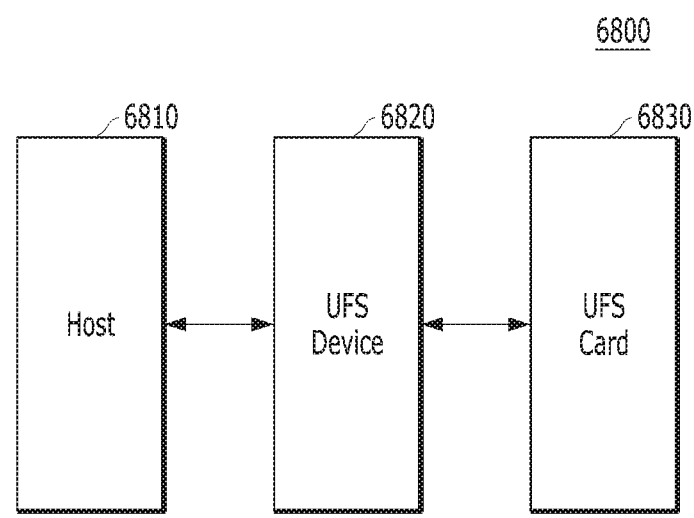

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. The host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
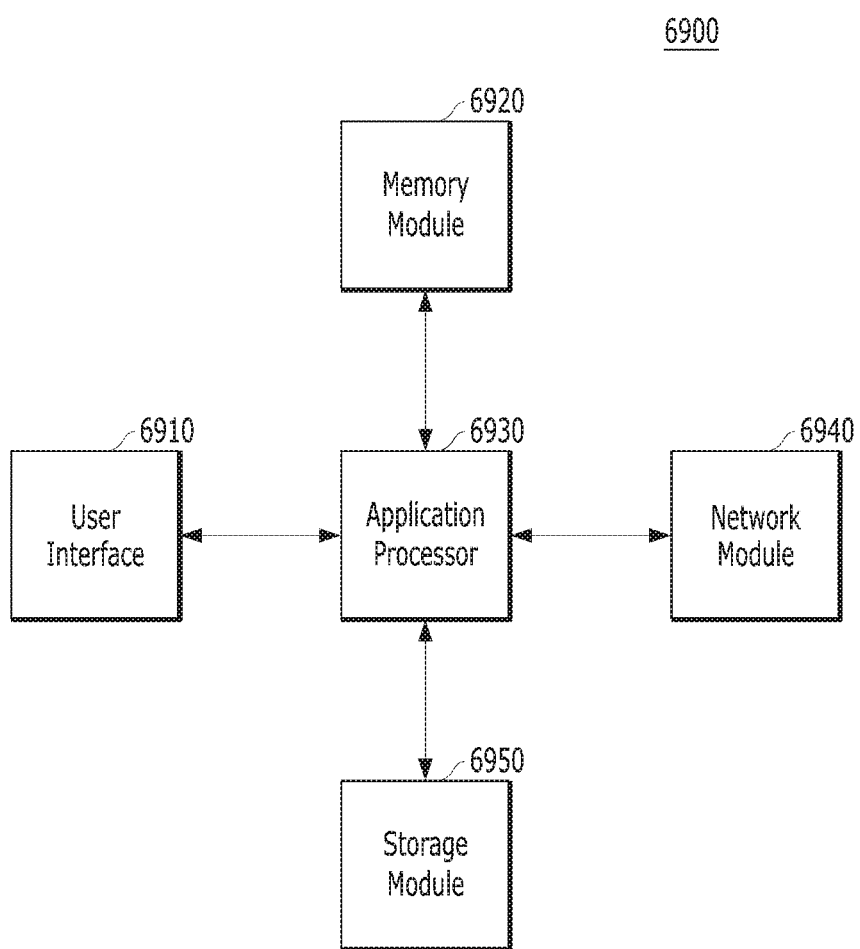

FIG. 18 is a diagram schematically illustrating another example of the data processing system including the memory system in accordance with an embodiment. By way of example, FIG. 18 is a diagram illustrating a user system 6900 to which the memory system may be applied.

Referring to FIG. 18, the user system 6900 may include a user interface 6910, a memory module 6920, an application processor 6930, a network module 6940, and a storage module 6950.

The application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR2 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 12 to 17.

The storage module 6950 may include a controller that determines the physical address allocation scheme as one of the first and second schemes based on the property of a write command, and controls the memory device to perform a write operation on a logical page corresponding to an allocated physical address according to the determined scheme.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a monitor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the application processor 6930 on a display/touch module of the mobile electronic device, or support a function of receiving data from the touch panel.

In accordance with the present embodiments, it is possible to provide a memory system capable of access performance of a superblock, and an operation method thereof.

Although various embodiments have been described for illustrative purposes, it will be apparent to those skilled in the art that various changes and modifications may be made without departing from the spirit and scope of the invention as defined in the following claims.

What is claimed is:

1. An operation method of a memory system which includes a first and a second memory dies each including physical pages each including a first and a second logical pages, the operation method comprising:
    allocating a stripe including physical pages included in each of the first and second memory dies for programming data chunks in response to a write command;
    selecting a stripping scheme among a first stripping scheme and a second stripping scheme based on an attribute of the write command or a number of the data chunks;
    mapping the data chunks to first logical pages and second logical pages in the stripe according to the selected stripping scheme; and
    performing a write operation on the stripe to program the data chunks according to a result of the mapping,
    wherein the first stripping scheme includes sequentially allocating logical pages included in the first memory die and then allocating logical pages included in the second memory die in the stripe to each of the data chunks, and
    wherein the second stripping scheme includes sequentially allocating first logical pages and then allocating second logical pages included in the stripe to each of the data chunks.

2. The operation method of claim 1, wherein the selecting of the stripping scheme includes:
    determining the stripping scheme as the first stripping scheme when the write command is a host write command, and
    determining the stripping scheme as the second stripping scheme when the write command is an internal write command.

3. The operation method of claim 2, wherein the performing of the write operation on the stripe includes performing a one-shot program operation in parallel by the first and second memory dies.

4. The operation method of claim 2, wherein the internal write command includes one of a garbage collection command, a wear-leveling command, and a read reclaim command.

5. The operation method of claim 1, wherein the selecting of the stripping scheme includes:
    determining the stripping scheme as the first stripping scheme when the number of the data chunks does not exceed a threshold value; and
    determining the stripping scheme as the second stripping scheme when the number of the data chunks exceeds the threshold value.

6. The operation method of claim 5, wherein the performing of the write operation on the stripe includes performing a one-shot program operation in parallel by the first and second memory dies.

7. The operation method of claim 1, further comprising storing map data indicating a corresponding relationship between logical addresses of data chunks and physical addresses of logical pages included in the stripe.

8. A memory system comprising:
    a first and a second memory dies each including physical pages each including a first and a second logical pages; and
    a controller suitable for controlling the memory device,
    wherein the controller comprises a processor suitable for:
    allocating a stripe including physical pages included in each of the first and second memory dies for programming data chunks in response to a write command;
    selecting a stripping scheme among a first stripping scheme and a second stripping scheme based on an attribute of the write command or a number of the data chunks; and
    mapping the data chunks to first logical pages and second logical pages in the stripe according to the selected stripping scheme, and
    wherein the memory device performs a write operation on the stripe to program the data chunks based on a result of the mapping,
    wherein the first stripping scheme includes sequentially allocating logical pages included in the first memory die and then allocating logical pages included in the second memory die in the stripe to each of the data chunks, and
    wherein the second stripping scheme includes sequentially allocating first logical pages and then allocating second logical pages included in the stripe to each of the data chunks.

9. The memory system of claim 8, wherein, when the write command is a host write command, the processor determines the stripping scheme as the first stripping scheme when the write command is a host write command, and determines the stripping scheme as the second stripping scheme when the write command is an internal write command.

10. The memory system of claim 9, wherein one or more planes corresponding to the allocated physical address among a plurality of planes included in each of the first and second memory dies of the memory device perform a one-shot program operation in parallel, such that the memory device performs the write operation.

11. The memory system of claim 9, wherein the internal write command includes one of a garbage collection command, a wear-leveling command, and a read reclaim command.

12. The memory system of claim 8, wherein the processor determines the stripping scheme as the first stripping scheme when the number of the data chunks does not exceed a threshold value, and determines the stripping scheme as the second stripping scheme when the number of the data chunks exceeds the threshold value.

13. The memory system of claim 12, wherein one or more planes corresponding to the stripe among a plurality of planes included in each of the dies of the memory device perform a one-shot program operation in parallel by the first and second memory dies.

14. The memory system of claim 8, wherein the processor stores map data indicating a corresponding relationship between logical addresses of the data chunks and physical addresses of logical pages included in the stripe.

15. A system comprising:
a memory device including a plurality of memory dies, each die including a plurality of memory blocks, each block including physical pages each including multiple logical pages; and
a controller suitable for:
receiving a write command;
determining one of a first allocation scheme and a second allocation scheme based on an attribute of the write command; and
performing a write operation for data corresponding to the write command, on a stripe including physical pages included in the each die according to the determined allocation scheme,
wherein the first allocation scheme sequentially stripes the data in the stripe in ascending order of a die, and
wherein the second allocation scheme sequentially stripes the data in the stripe in ascending order of a logical page.

* * * * *